United States Patent [19]

Chow et al.

[11] Patent Number: 4,632,719
[45] Date of Patent: Dec. 30, 1986

[54] SEMICONDUCTOR ETCHING APPARATUS WITH MAGNETIC ARRAY AND VERTICAL SHIELD

[75] Inventors: Robert Chow, Fremont; Steven D. Downey, Burlingame, both of Calif.

[73] Assignee: Varian Associates, Inc., Palo Alto, Calif.

[21] Appl. No.: 777,382

[22] Filed: Sep. 18, 1985

[51] Int. Cl.⁴ .................. B44C 1/22; C03C 15/00; H01L 21/306; C23F 1/02
[52] U.S. Cl. ............................ 156/345; 156/643; 156/646; 204/298
[58] Field of Search ............... 156/643, 646, 345; 204/192 E, 298; 427/38, 39; 118/728, 50.1, 620, 621, 623

[56] References Cited

U.S. PATENT DOCUMENTS

| | | | |
|---|---|---|---|
| 3,669,861 | 6/1972 | Cash | 204/192 |
| 3,708,418 | 1/1973 | Quinn | 204/298 |
| 4,025,410 | 5/1977 | Stewart | 204/192 R |
| 4,162,954 | 7/1979 | Morrison | 204/298 |
| 4,169,031 | 9/1979 | Brors | 204/192 R |
| 4,239,611 | 12/1980 | Morrison | 204/298 |
| 4,243,505 | 1/1981 | Penfold | 204/298 |
| 4,265,729 | 5/1981 | Morrison | 204/298 |
| 4,282,083 | 8/1981 | Kertesz et al. | 204/192 R |
| 4,341,616 | 7/1982 | Nagatomo et al. | 204/298 |
| 4,384,933 | 5/1983 | Takasaki | 204/192 D |
| 4,392,932 | 7/1983 | Harra | 204/192 E |
| 4,401,539 | 8/1983 | Abe et al. | 204/192 R |
| 4,415,427 | 11/1983 | Hidler et al. | 204/298 |
| 4,431,473 | 2/1984 | Okano et al. | 156/345 |
| 4,444,643 | 4/1984 | Garrett | 204/298 |
| 4,526,643 | 7/1985 | Okano et al. | 156/345 |

OTHER PUBLICATIONS

"High Rate Reactive Ion Etching Using a Magnetron Discharge", Haruo Okano et al, *Solid State Technology*, Apr. 1982, pp. 166 et seq.

Primary Examiner—William A. Powell
Attorney, Agent, or Firm—Stanley Z. Cole; Kenneth L. Warsh

[57] ABSTRACT

In an apparatus for etching a large semiconductor wafer the etch rate and uniformity of etching at the edges is improved by using an array of magnets behind the collector plate to form a double ring of plasma and using a grounded shield ring with perforations to pass gases. The shield ring extends both above and below the surface of the wafer being etched.

7 Claims, 5 Drawing Figures

SEMICONDUCTOR ETCHING APPARATUS WITH MAGNETIC ARRAY AND VERTICAL SHIELD

FIELD OF THE INVENTION

The invention pertains to a device for RF etching of a semiconductor wafer, particularly to a device for RF etching incorporating an array of fixed magnets with a vertical shield.

BACKGROUND OF THE INVENTION

Glow discharge plasmas have long been used for cleaning semiconductor wafers. Various configurations of magnets are often used to trap electrons in the plasma thereby enhancing the efficiency of the device and minimizing the damage to the semiconductor due to electron bombardment. As the size of production semiconductor wafers has increased, it has been necessary to redesign the etching apparatus. Lessons learned for etching small wafers, unfortunately, do not apply for apparatus for larger wafers since the dark spaces inherent in the plasma do not scale in proportion to increased size. Each increase in the size of the wafer necessitates new research into the optimum apparatus configuration for that size.

OBJECT OF THE INVENTION

The object of the invention is to provide a device for etching semiconductor wafers which is capable of high etch rate and high etch uniformity across the wafer for wafers from 8 inches diameter down to 3 inches diameter.

SUMMARY OF THE INVENTION

The semiconductor wafer etching device uses an RF etch in an argon atmosphere in combination with an array of fixed cobalt-samarium magnets which confine the resulting plasma to a double loop. A vertical shield with perforations to pass gas located along the edge of the wafer extends above and below the wafer to reduce uneven etching at the edges of the wafer.

These and further constructional and operational characteristics of the invention will be more evident from the detailed description given hereinafter with reference to the figures of the accompanying drawings which illustrate preferred embodiments by way of non-limiting examples.

DESCRIPTION OF THE PREFERRED EMBODIMENTS

Figure 1:
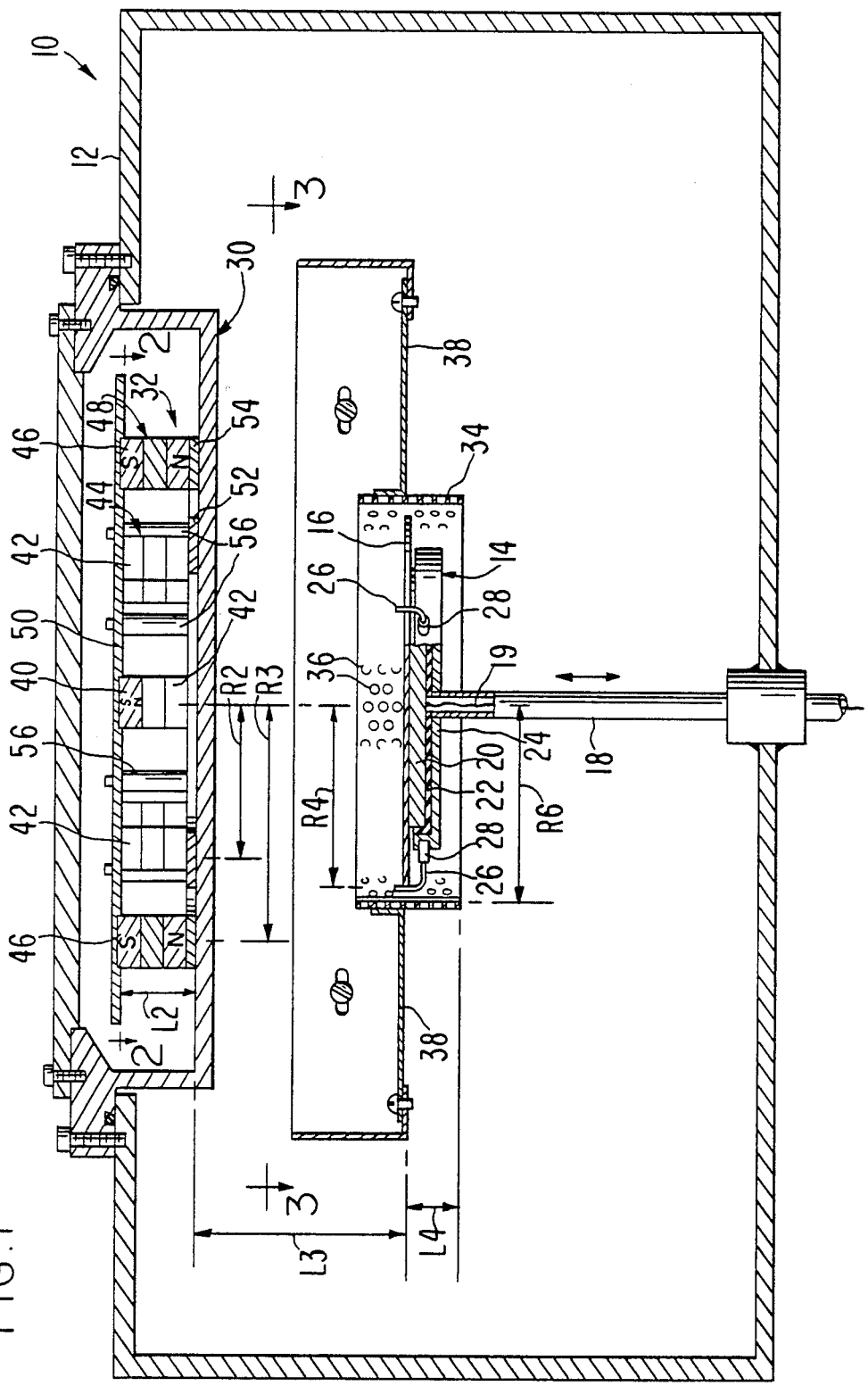
FIG. 1 is a schematic partial section of the etching apparatus according to the invention.
Figure 2:
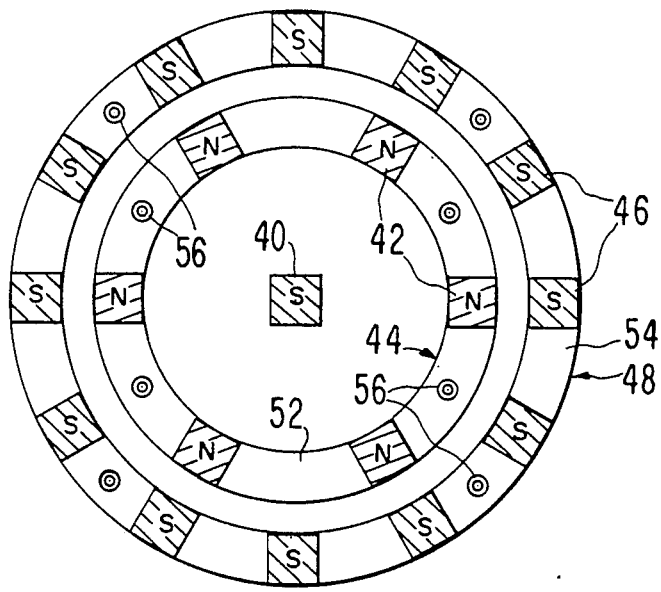
FIG. 2 is a top view of a section of the magnet assembly.
Figure 3:
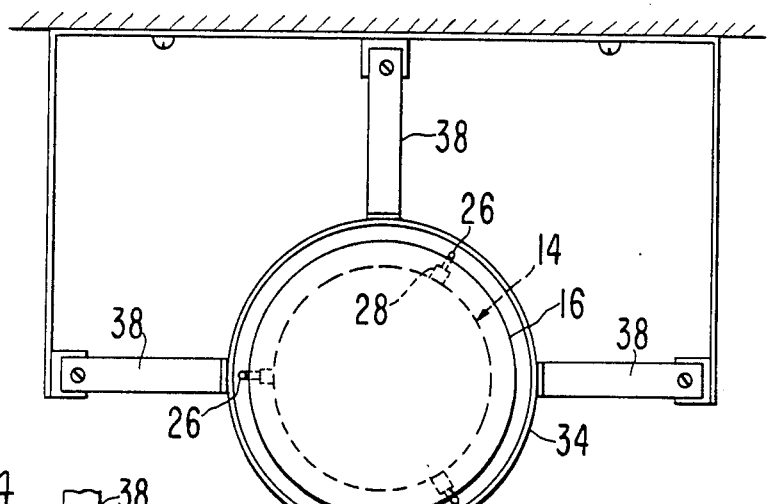
FIG. 3 is a top view of the primary RF shield.

Referring now to the drawings wherein reference numerals are used to designate parts throughout the various figures thereof, there is shown in FIG. 1 the etching apparatus 10 according to the invention. The etching takes place in a chamber 12 from which air has been evacuated and into which a low pressure atmosphere of 3 to 15 microns of Argon gas is introduced. A wafer holder 14 is used to hold a semiconductor wafer 16 in place for the etching. The wafer holder 14 is made of a coaxial support 18 which supplies physical support and an electrical conductor 19 through its center. The electrical conductor is used to supply RF power at 13.5 Mhz and 1,500 volts peak-to-peak for etching to the wafer contact plate 20. An insulator 22 is provided around the wafer contact plate 20. A wafer table shield 24 of metal is provided around the insulator 22 and is electrically grounded through the outer layer of the support 18. Wafer support arms 26 are mounted on insulators 28 and are allowed to float electrically.

Details of the wafer lifting and holding apparatus are given in U.S. Pat. No. 4,558,984 to Garrett, assigned in common with the subject invention.

There is provided a catcher plate 30 at electrical ground opposite the surface of the wafer being etched. On the opposite side of the catcher plate 30 there is a magnet array 32. Around the wafer holder 14 there is a shield 34 which extends above and below the wafer 16 in close proximity with the edge of the wafer to enhance uniformity of etching at the edge of the wafer. The shield 34 is electrically grounded. The shield 34 is provided with small perforations 36 to allow the flow of gas through the shield. The shield 34 is provided with a shield support structure 38 to hold it in place. The catcher plate 30, shield 34 and support 38 may be made of any non-magnetic conductor but stainless steel type 304 is particularly suitable for cleaning.

The magnet array 32 is assembled by stacking permanent magnets in an array so as to form a double ring of plasma between the catcher plate 30 and the wafer. Permanent magnets of the cobalt-samarium type are preferred for their high stability under the stress of high temperature and adverse magnetic fields. In particular, HICOREX 90A magnets manufactured by Hitachi Magnetics Corporation having an intrinsic coercive force of 30,000 oersteds and a residual induction of 8200 gauss are particularly suitable. These magnets are manufactured by imposing a field on a powder of $SmCo_5$ and sintering the powder in the field.

In one preferred embodiment the magnet array 32 is assembled from square bar units of Hitachi No. 90532A HICOREX permanent magnets. Each magnet is 0.75×0.75 inches in cross-section and 0.32 inches from pole-to-pole. One magnet 40 is used at the center of the magnet array 32. Stacks of three magnets 42 in 6 stacks are located evenly spaced on an inner ring 44 and around the center magnet 40. Other stacks of three magnets 46 in twelve stacks are located evenly spaced on an outer ring 48 around the center magnet 40. The polarity of the stacks 46 on the outer ring 48 is the same as the center magnet 40.

The magnet assembly 32 is assembled between a top plate 50, an inner annular plate 52 and an outer annular plate 54. The top plate 50 has grooves formed to hold the closest magnets in place. The remaining magnets in each stack of three are held by magnetic attraction. Spacers 56 with bolts are used to hold the inner annular plate 52 and outer annular plate in the assembly. The top plate 50 and annular rings 52, 54 are made of material of high magnetic susceptibility such as cold-rolled steel type 1018 or 1020.

Figure 4:
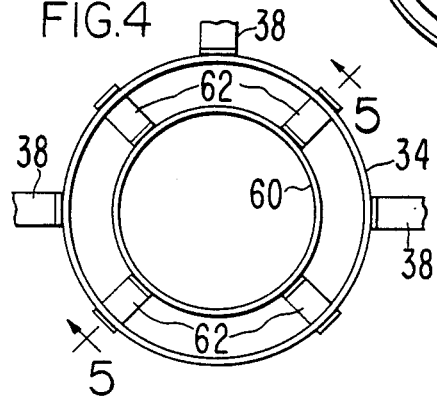
FIG. 4 is a top view of the second RF shield attached to the primary RF shield.
Figure 5:
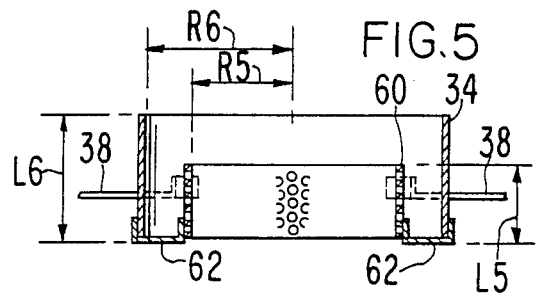
FIG. 5 is a sectional view of the assembly of FIG. 4.

This embodiment is particularly suitable for etching large wafers. If it is desired to etch smaller wafers in an apparatus according to the invention designed for large wafers, a second shield 60 as shown in FIGS. 4 and 5 can be assembled inside shield 34 and attached to shield 34 with brackets 60.

In the prior art various configurations of electrical shielding rings were used at and above the wafer but at smaller wafer sizes it was not clear that it was necessary to extend the shield ring below the wafer. See for example U.S. Pat. No. 4,392,932 to Harra. At larger wafer sizes such as the 8 inch size which motivated the subject invention, the inadequacy of prior art shielding rings became apparent. It is an important teaching of the invention that an optimum uniformity of etching is achieved if the shielding ring is also extended significantly below the face of the wafer being etched.

Typical dimensions and a range of tolerable dimensions as labeled in the Figures are given in Table 1. A range of wafer diameters from 3 to 10 inches diameter are assumed. For wafers of 4 inches diameter or less a second RF shield as described above is necessary.

TABLE 1

| Variable | Typical (Inches) | Spread (Inches) |
|---|---|---|
| $R_2$ | 3.0 | 2 to 6 |
| $R_3$ | 3.9 | 3 to 7 |
| $R_4$ | 3.0 | 1.5 to 5 |
| $R_5$ | 3.25 | $R_4 + 1$ |
| $R_6$ | 3.25 | $R_2$ to $R_3$ |
| $L_2$ | 1.30 | |
| $L_3$ | 2.3 | 0.5 to 7.0 |
| $L_4$ | 0.75 | 0.125 to 2.5 |
| $L_5$ | 1.50 | $L_4$ to $4 \times L_4$ |
| $L_6$ | 2.5 | $L_4$ to $4 \times L_4$ |

The etching apparatus according to the invention has the advantages of first, having an etch rate approximately three times greater than prior apparatus not using magnets, second, having an etch rate across the wafer that is much more uniform than in the prior art, and third, being simpler and less expensive than some apparatus of the prior art.

This invention is not limited to the preferred embodiment and alternatives and improvements may be made including mechanically and electrically equivalent modifications to component parts, without departing from the scope of protection of the present patent and true spirit of the invention, the characteristics of which are summarized in the following claims.

What is claimed is:

1. An apparatus for etching a face of a semiconductor wafer in an RF field comprising:
   a chamber capable of being substantially evacuated of atmospheric gases;
   means for introducing Argon gas into said chamber;
   a means for connecting said means for holding to a source of RF power;
   an electrical shield surrounding the wafer in said chamber, said shield being in close proximity to edge of the wafer and extending above and below the wafer;
   means for inducing a magnetic field in close proximity to the face of the wafer being etched, said means for inducing a magnetic field including means for forming at least two concentric coplanar rings of plasma between the surface of the wafer being etched and an opposing wall of said chamber.

2. An apparatus as in claim 1 wherein said electrical shield is formed of thin metal with perforations therein whereby to enhance the free flow of gas.

3. An apparatus as in claim 2 wherein said means for inducing a magnetic field includes a generally planar array of samarium-cobalt permanent magnets.

4. An apparatus as in claim 3 wherein said array of samarium-cobalt magnets are arranged as a central magnet, a first ring of magnets of polarity opposite said central magnet in a circle around said central magnet, and a second ring of magnets concentric with said first ring, said second ring having the same polarity as said central magnet.

5. An apparatus for etching a face of a semiconductor wafer in an RF field, comprising:
   a means for isolating the wafer in a substantially pure atmosphere of low pressure Argon;
   a means for inducing a high voltage RF field on the wafer sufficient to ionize and accelerate Argon atoms toward the surface of the wafer being etched; and
   magnet means for forming a plasma into at least two concentric rings in a plane parallel and opposite the surface of the wafer being etched.

6. An apparatus as in claim 5 wherein said magnet means includes a generally planar array of samarium-cobalt magnets arranged as a central magnet and two concentric rings of magnets of polarity alternating from said central magnet to an inner ring of said concentric rings and alternating again from said inner ring to an outer of said concentric rings.

7. An apparatus for etching a face of a semiconductor wafer in an RF field, comprising:
   a means for holding a wafer, said means being connected to a source of RF power;
   a metal shield surrounding and in close proximity to the edge of the wafer, said shield extending above and below the wafer, said shield being electrically at polarity opposite said means for holding the wafer, said shield having formed therein a multiplicity of perforation whereby to enhance the passage of gas;
   chamber means for holding the wafer and said shield in a substantially pure atmosphere of Argon at low pressure, said chamber having a wall in close proximity to the face of the wafer being etched, and
   an array of magnets behind said wall of said chamber means which is in close proximity to the face of the wafer being etched, said magnets being arranged as a center magnet and rings of magnets concentric with said center, said center and said rings having alternately opposing polarity whereby to hold concentric rings of plasma between the face of the wafer being etched and said wall of said chamber means in close proximity to the wafer.

* * * * *